(12) United States Patent
Kobayashi

(10) Patent No.: US 11,387,904 B2
(45) Date of Patent: Jul. 12, 2022

(54) POWERED DEVICE AND POWER SOURCING EQUIPMENT OF OPTICAL POWER SUPPLY SYSTEM, AND OPTICAL POWER SUPPLY SYSTEM

(71) Applicant: KYOCERA CORPORATION, Kyoto (JP)

(72) Inventor: Takahiro Kobayashi, Sagamihara (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/489,688

(22) Filed: Sep. 29, 2021

(65) Prior Publication Data

US 2022/0021453 A1    Jan. 20, 2022

Related U.S. Application Data

(63) Continuation of application No. 17/442,618, filed as application No. PCT/JP2020/038944 on Oct. 15, 2020.

(30) Foreign Application Priority Data

Oct. 24, 2019  (JP) .............................. JP2019-193121
Oct. 28, 2019  (JP) .............................. JP2019-195210

(51) Int. Cl.
  *H04B 10/00* (2013.01)
  *H04B 10/25* (2013.01)
  *G02B 6/42* (2006.01)

(52) U.S. Cl.
  CPC .......... *H04B 10/25* (2013.01); *G02B 6/4206* (2013.01)

(58) Field of Classification Search
  CPC ...... H04B 10/25; H04B 10/50; H04B 10/564; H04B 10/40; H04B 10/503; H04B 10/5055; H04B 10/43; G02B 6/4206; H04J 14/0221
  USPC ....... 398/137, 162, 195, 206, 209, 135, 136, 398/138, 171
  See application file for complete search history.

(56) References Cited

U.S. PATENT DOCUMENTS 4,689,482 A * 8/1987 Horikawa ............ G02B 26/123
                                          219/121.61
5,528,409 A    6/1996 Cucci et al.
9,979,480 B1   5/2018 Schubert
               (Continued)

FOREIGN PATENT DOCUMENTS

JP    S58139538 A     8/1983
JP    H10510418 A    10/1998
               (Continued)

*Primary Examiner* — Hibret A Woldekidan
(74) *Attorney, Agent, or Firm* — Hauptman Ham, LLP

(57) ABSTRACT

A powered device of an optical power supply system includes a photoelectric conversion element, a semiconductor laser for feedback and a control device. The photoelectric conversion element converts feed light into electric power, wherein the feed light is from a power sourcing equipment. The semiconductor laser oscillates with a portion of the electric power, thereby outputting feed light to a power supplying side. The control device monitors a power supply amount of the electric power to a load, and according to the power supply amount, controls an electricity-light conversion amount of conversion that is performed by the semiconductor laser.

7 Claims, 8 Drawing Sheets

(56) References Cited

U.S. PATENT DOCUMENTS

| | | |
|---|---|---|
| 2013/0301984 A1* | 11/2013 | Chan .................. H02J 50/30 |
| | | 385/24 |
| 2017/0111109 A1* | 4/2017 | Yamamoto ............. H04B 10/03 |
| 2019/0213871 A1 | 7/2019 | Van Der Mark et al. |
| 2020/0396426 A1 | 12/2020 | Price et al. |

FOREIGN PATENT DOCUMENTS

| | | |
|---|---|---|
| JP | H1189120 A | 3/1999 |
| JP | 200125180 A | 1/2001 |
| JP | 2010135989 A | 6/2010 |
| JP | 20151925 A | 1/2015 |

* cited by examiner

POWERED DEVICE AND POWER SOURCING EQUIPMENT OF OPTICAL POWER SUPPLY SYSTEM, AND OPTICAL POWER SUPPLY SYSTEM

RELATED APPLICATIONS

The present application is a continuation of U.S. patent application Ser. No. 17/442,618 filed on Sep. 24, 2021, which is a National Phase of International Application Number PCT/JP2020/038944 filed Oct. 15, 2020 and claims priority to Japanese Application Numbers 2019-193121 filed Oct. 24, 2019 and 2019-195210 filed Oct. 28, 2019. The entire contents of which applications are incorporated herein by their reference.

TECHNICAL FIELD

The present disclosure relates to optical power supply.

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding, and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, ideally, electric power transmitted from the power supplying side is all consumed at the power receiving side. However, the load is not constant but fluctuates, and hence electric power more than consumed by the load could be transmitted. In this case, electric power is left at the power receiving side, which is inefficient.

Solution to Problem

An aspect of the present disclosure is an optical power supply system including:
a power sourcing equipment including a semiconductor laser that oscillates with electric power, thereby outputting feed light; and
a powered device including a photoelectric conversion element that converts the feed light into electric power, the feed light being from the power sourcing equipment,
wherein the powered device includes:
a photoelectric conversion element that converts feed light into electric power, the feed light being from a power sourcing equipment;
a semiconductor laser for feedback that oscillates with a portion of the electric power obtained by the conversion by the photoelectric conversion element, thereby outputting feed light to a power supplying side; and
a control device that monitors a power supply amount of the electric power to a load, the electric power being obtained by the conversion by the photoelectric conversion element, and according to the power supply amount, controls an electricity-light conversion amount of conversion that is performed by the semiconductor laser, and
wherein the power sourcing equipment includes:
a semiconductor laser that oscillates with electric power, thereby outputting feed light to a powered device; and
a photoelectric conversion element for feedback that converts feed light into electric power, the feed light being from the powered device, and outputs the electric power as driving power for the semiconductor laser.

An aspect of the present disclosure is an optical power supply system includes:
a power sourcing equipment including a semiconductor laser that oscillates with electric power, thereby outputting feed light; and
a powered device including a photoelectric conversion element that converts the feed light into electric power, the feed light being from the power sourcing equipment,
wherein the powered device includes:
a photoelectric conversion element that converts feed light into electric power, the feed light being from a power sourcing equipment;
an optical branching device for feedback that outputs a portion of the feed light to be input to the photoelectric conversion element from the power sourcing equipment, to a power supplying side as feedback feed light; and
a control device that monitors a power supply amount of the electric power to a load, the electric power being obtained by the conversion by the photoelectric conversion element, and according to the power supply amount, controls a feedback amount of feedback that is performed by the optical branching device, and
wherein the power sourcing equipment includes:
a semiconductor laser that oscillates with electric power, thereby outputting feed light to a powered device;
an optical combining device for feedback that combines feedback feed light that is from the powered device and the feed light output by the semiconductor laser into combined feed light, and outputs the combined feed light; and
a control device that controls output of the semiconductor laser such that an energy amount that the optical combining device outputs is constant.

Advantageous Effects of Invention

An optical power supply system according to an aspect of the present disclosure enables execution of efficient optical power supply with surplus electric power at the power receiving side controlled even if the load fluctuates.

DESCRIPTION OF EMBODIMENTS

Hereinafter, embodiments of the present disclosure will be described with reference to the drawings.

(1) Outline of System

First Embodiment

Figure 1:
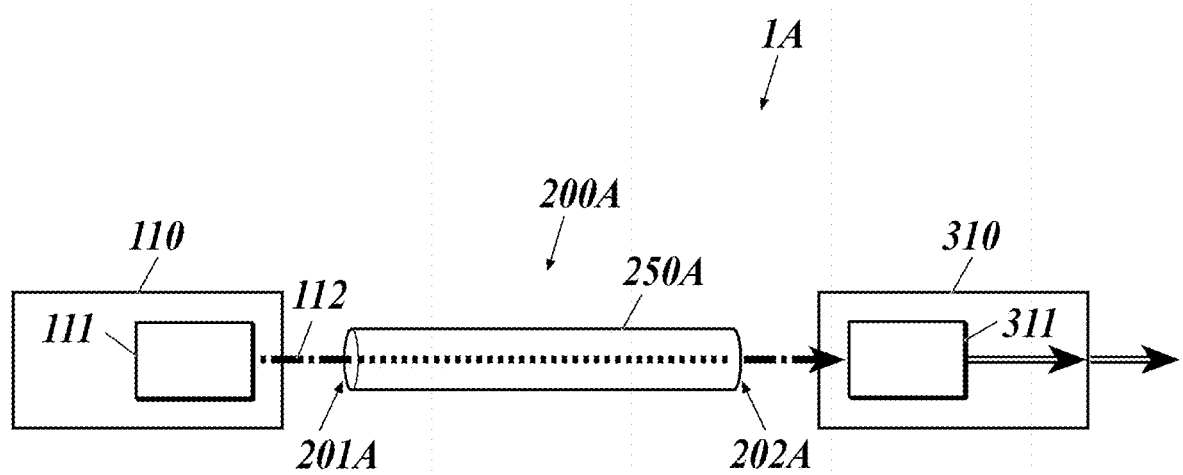
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
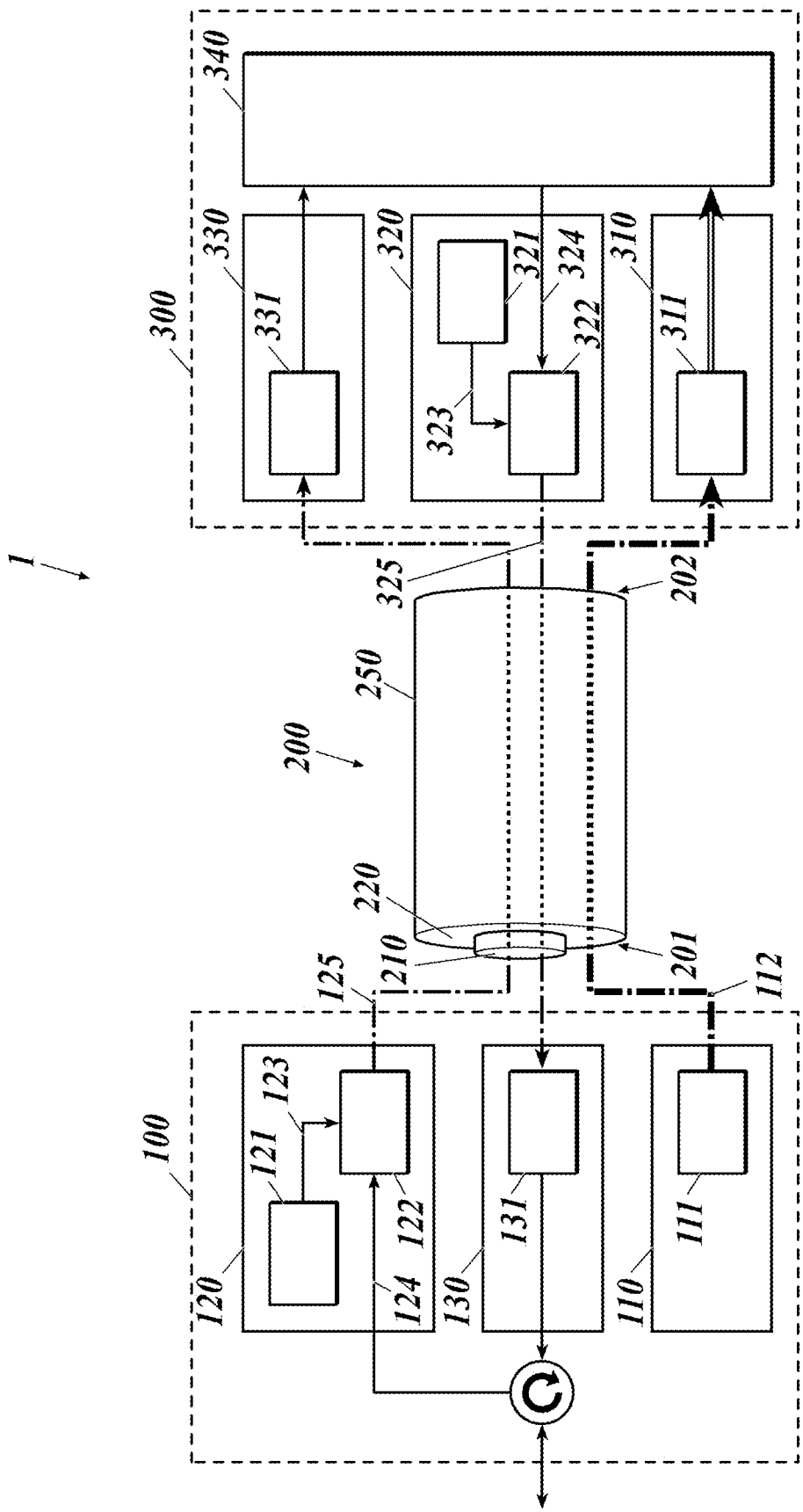
FIG. 2 is a block diagram of a power over fiber system according to a second embodiment of the present disclosure.

As shown in FIG. 2, a power over fiber (PoF) system 1 of this embodiment includes a power supply system through an optical fiber and an optical communication system therethrough, and includes: a first data communication device 100 including a power sourcing equipment (PSE) 110; an optical fiber cable 200; and a second data communication device 300 including a powered device (PD) 310.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
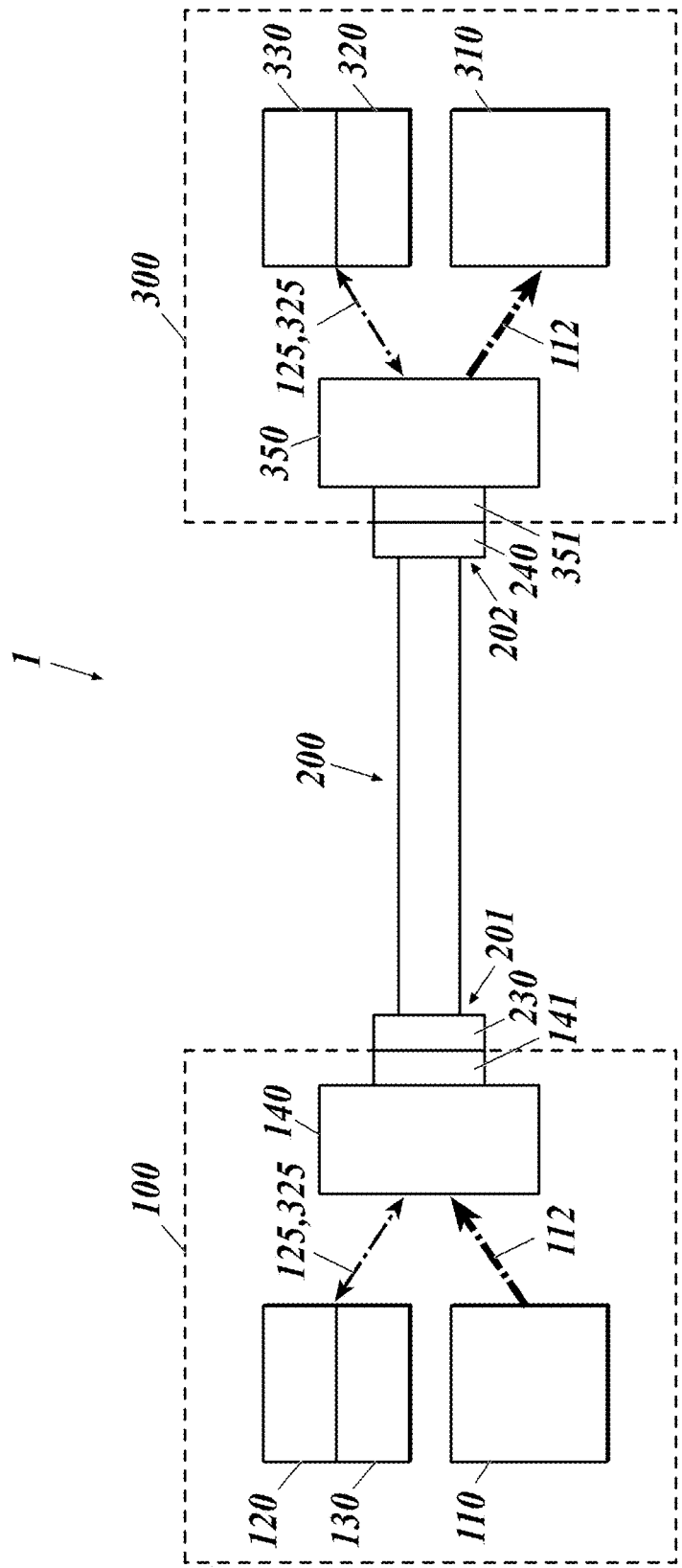
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125, 325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
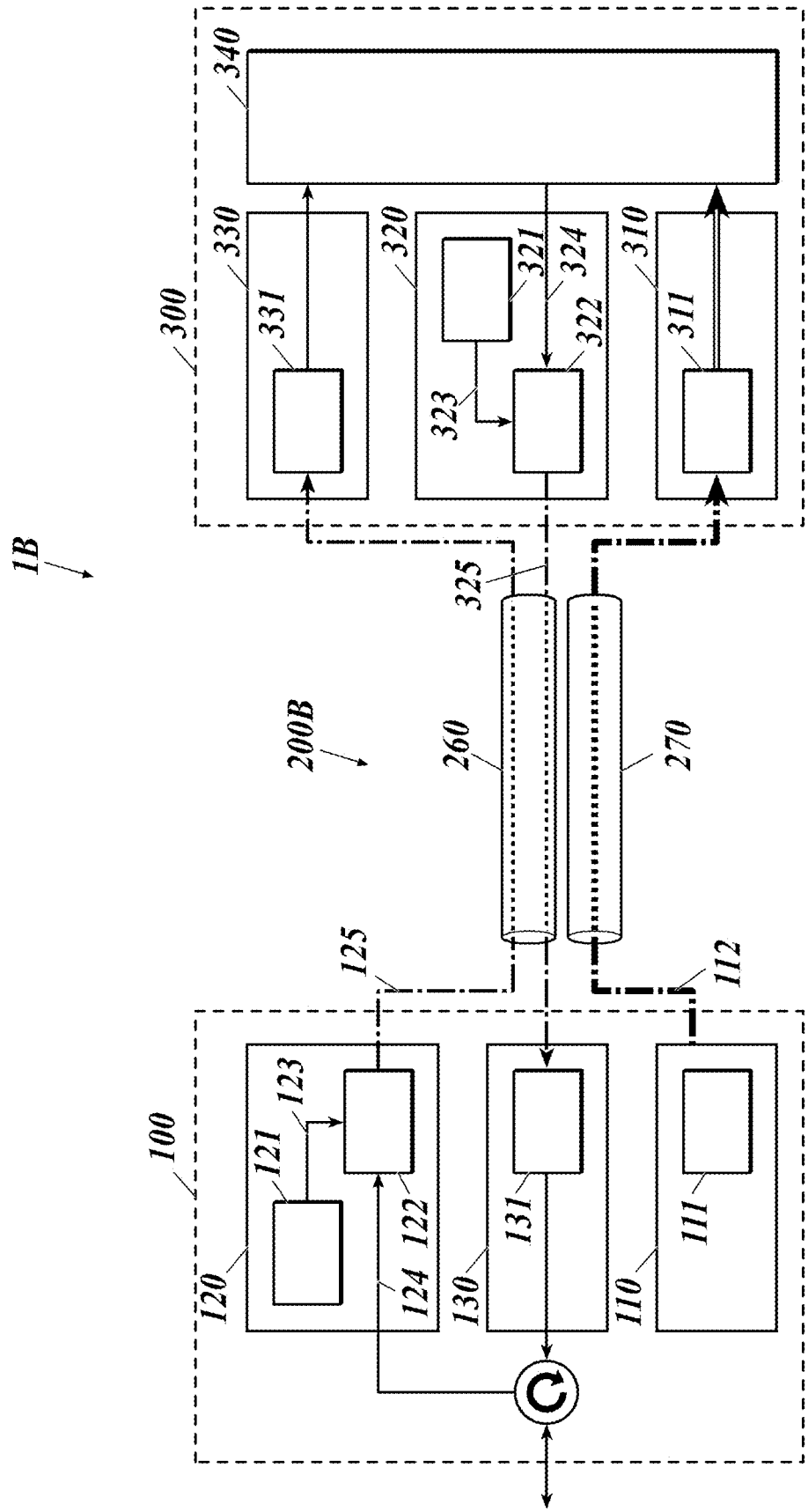
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Control of Feedback Power Supply

Next, control of feedback power supply will be described with reference to FIG. 5, FIG. 6 and FIG. 7 in addition to FIG. 1 to FIG. 4.

Figure 5:
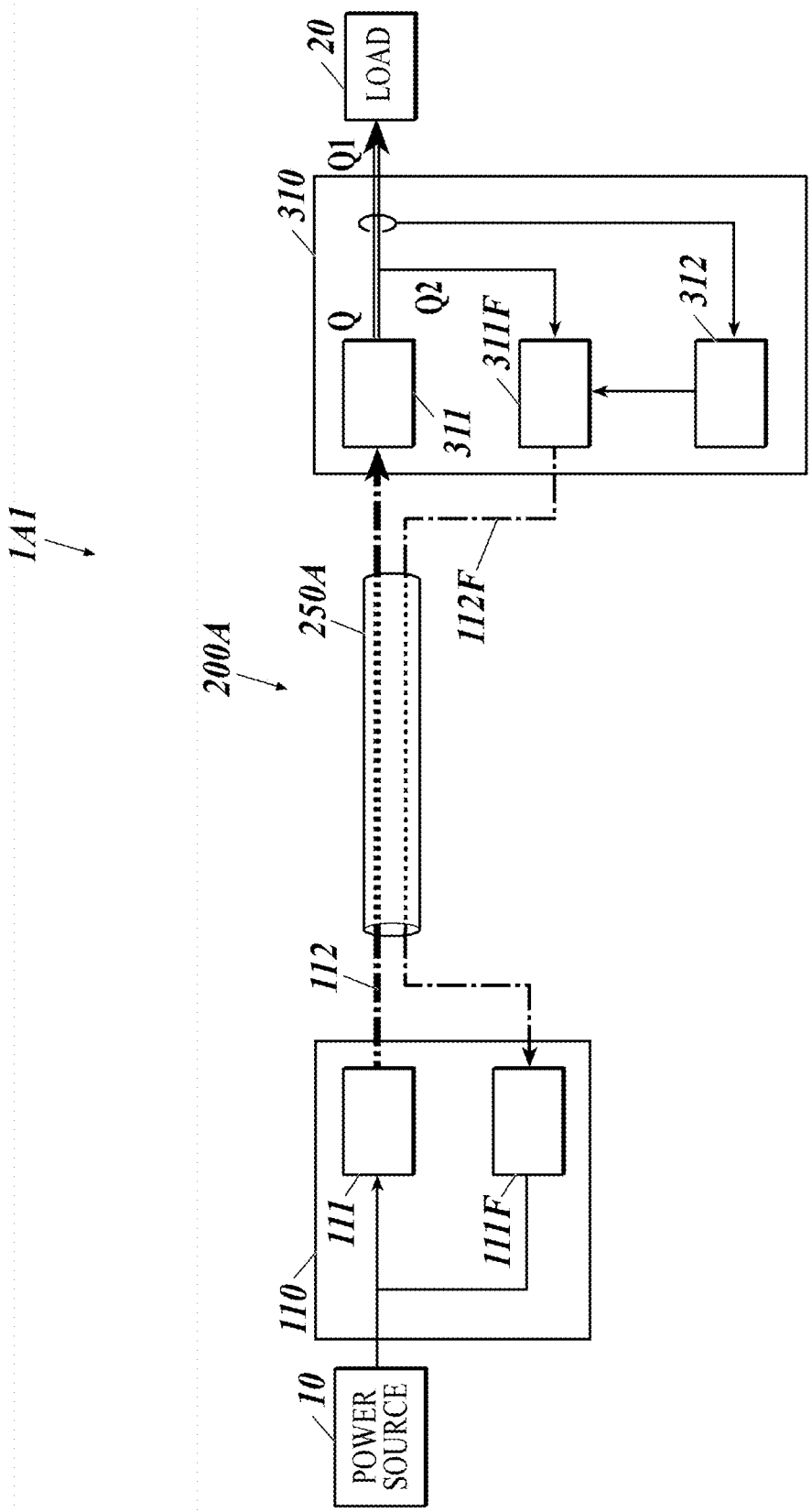
FIG. 5 is a block diagram of a power over fiber system provided with a function of feedback power supply.

FIG. 5 shows a configuration of a power over fiber system 1A1 provided with a function of feedback power supply.

The power over fiber system 1A1 is configured by further having the following components in the powered device 310 and the power sourcing equipment 110 of the power over fiber system 1A (configured as shown in FIG. 1) described as the first embodiment.

The powered device 310 includes a semiconductor laser 311F for feedback and a control device 312. The semiconductor laser 311F oscillates with a portion of the electric power obtained by the conversion by the photoelectric conversion element 311, thereby outputting feedback feed light 112F to the power supplying side. The control device 312 monitors the power supply amount (Q1) of the electric power (Q) that is supplied to a load 20, the electric power (Q) being obtained by the conversion by the photoelectric conversion element 311, and controls the electricity-light conversion amount of conversion that is performed by the semiconductor laser for feedback, namely a feedback power supply amount (Q2), according to the power supply amount (Q1).

The power sourcing equipment 110 includes a photoelectric conversion element 111F for feedback. The photoelectric conversion element 111F converts the feedback feed light 112F into electric power, the feedback feed light 112F being from the powered device 310, and outputs the electric power as a portion of driving power for the semiconductor laser 111.

The semiconductor laser 111 outputs the feed light 112 with a constant energy value. This is converted into the electric power Q by the photoelectric conversion element 311 of the powered device 310. Hence, the electric power Q is also a constant value. FIG. 6 and FIG. 7 each show a graph of temporal change in the electric power Q and so forth.

Figure 6:
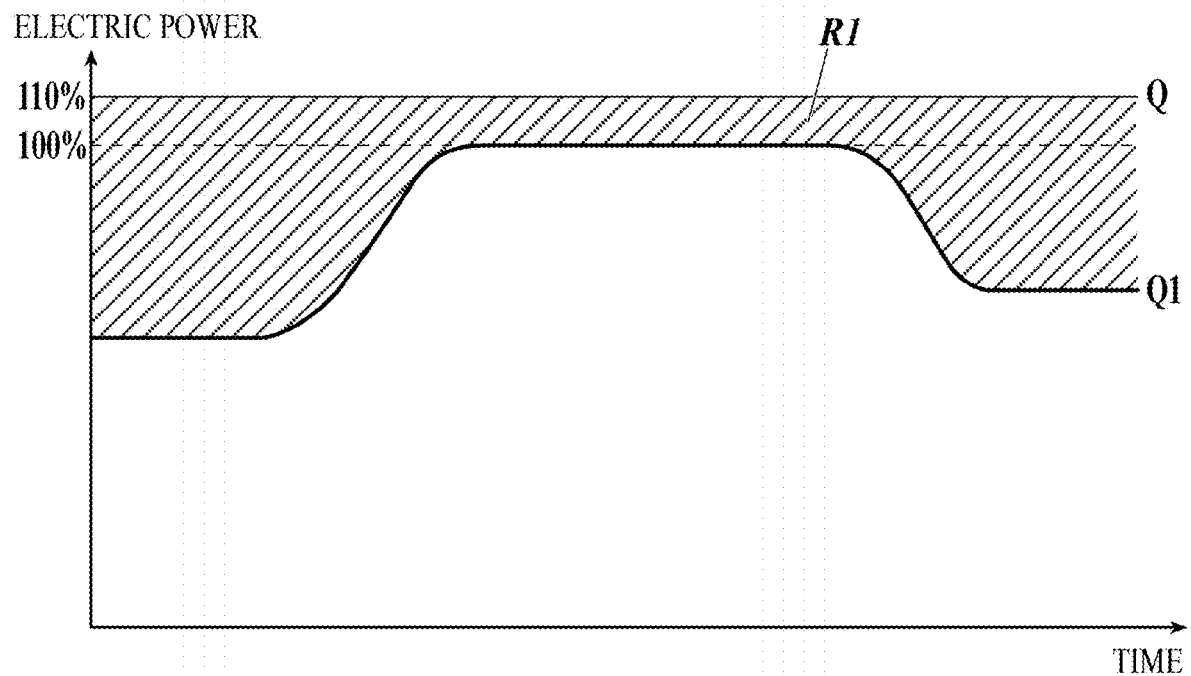
FIG. 6 is a graph showing temporal change in electric power demand and supply in a comparative example.
Figure 7:
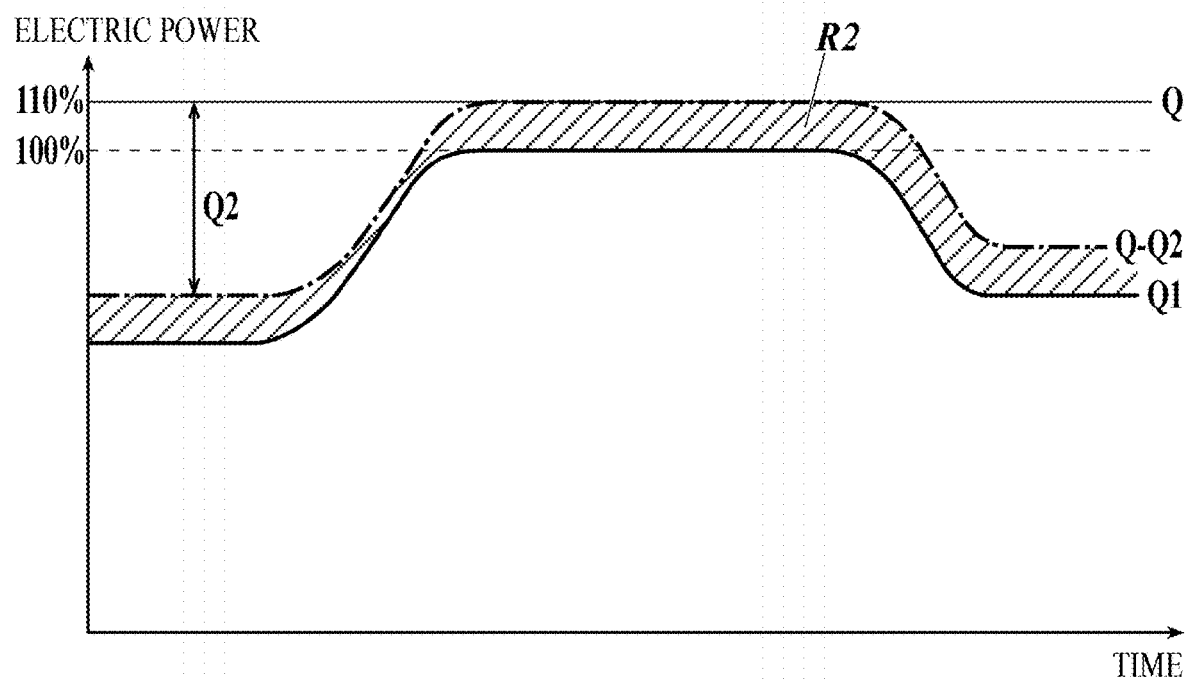
FIG. 7 is a graph showing temporal change in electric power demand and supply in the power over fiber system shown in FIG. 5.

The power supply amount Q1 to the load 20 fluctuates according to the operation status of the load 20, for example, as shown in FIG. 6.

FIG. 6 shows a case where 110% electric power Q is prepared, wherein the maximum value of the load 20 is 100%. Since the load 20 fluctuates in the range of up to the maximum value, no electric power shortage occurs, and consequently the system can be prevented from going down.

However, in this case, surplus electric power R1 is wasted, which is inefficient.

The control device 312 controls the electricity-light conversion amount of conversion, which is performed by the semiconductor laser 311F, namely the feedback power supply amount Q2, such that the value (Q−Q2) obtained by subtracting the conversion amount Q2 from the electric power Q obtained by the conversion by the photoelectric conversion element 311 converges to a target value that exceeds the load 20 by a predetermined percentage.

In this manner, a portion of the surplus electric power R1 is transmitted to the power supplying side as the feedback power supply amount Q2.

The feedback power supply amount Q2 is input to the photoelectric conversion element 111F as the feedback feed light 112F and converted by the photoelectric conversion element 111F into electric power that serves as the driving power for the semiconductor laser 111.

The driving power for the semiconductor laser 111 is covered by this electric power, which is based on the feedback power supply amount Q2, and electric power newly provided from a power source 10.

The lower limit of the predetermined percentage is 0%, and the upper limit thereof is a percentage by which the electric power Q exceeds the maximum value of the load 20. In this example, the percentage by which the electric power Q exceeds the maximum value of the load 20 is 10%. Hence, the predetermined percentage is set in the range of 0-10%. For example, the target value is set to a value that is 10% higher than the load 20, which is shown in FIG. 7.

If the power supply amount Q1 to the load 20 is the maximum value, 100%, the feedback power supply amount Q2 is zero and no feedback is performed. As the power supply amount Q1 to the load 20 decreases from the maximum value, the feedback power supply amount Q2 is increased to keep surplus electric power R2 small.

Although the semiconductor laser 111 outputs the feed light 112 with a constant energy value, and the feed light 112 is converted into the electric power Q, which is constant, by the photoelectric conversion element 311 of the powered device 310, since the electric power Q2, which is unconsumed by the load 20, is fed back, the electric power newly provided from the power source 10 is only "Q−Q2" equivalent, which enables execution of efficient optical power supply with the surplus electric power R2 at the power receiving side controlled even if the load 20 fluctuates.

In the above description, loss due to the conversion efficiency, the transmission efficiency and so forth being not 100% is ignored.

The load 20 includes an external load (electric power that is output for an external device(s)) in addition to the driving power needed in the powered device 310, but excludes the feedback power supply amount Q2.

The power over fiber system 1A1 shown in FIG. 5 is configured by the first embodiment as a base, but may be configured by the power over fiber system 1 or 1B (configured as shown in FIG. 2 to FIG. 4), the power over fiber system 1 being described as the second embodiment, as a base with the components (111F, 311F, 312) for achieving the function of feedback power supply added in the same manner, thereby being carried out as a configuration including an optical communication system.

In this case, the electric power Q obtained by the conversion by the photoelectric conversion element 311 of the powered device 310 is also used as the driving power for the transmitter 320 and the receiver 330 of the second data communication device 300.

(3) Control of Feedback Feed Light

Next, control of feedback feed light will be described with reference to FIG. 6, FIG. 8 and FIG. 9 in addition to FIG. 1 to FIG. 4.

Figure 8:
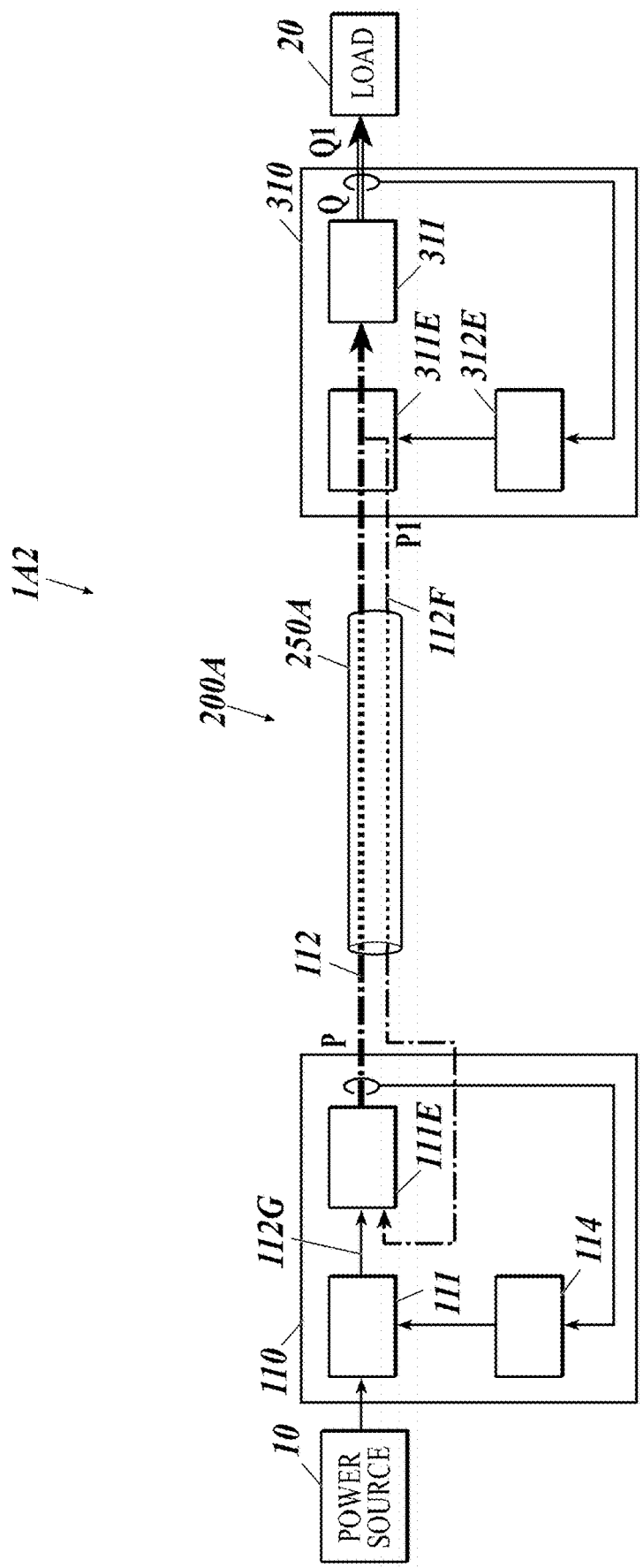
FIG. 8 is a block diagram of a power over fiber system provided with a function of feedback feed light.
Figure 9:
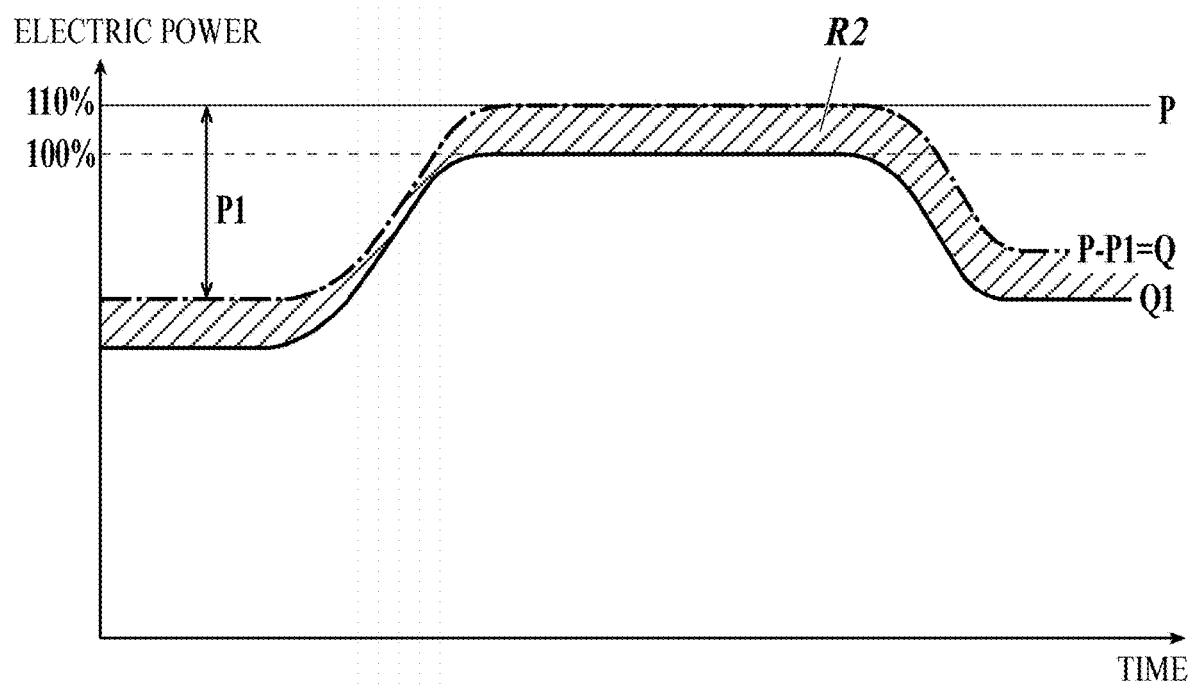
FIG. 9 is a graph showing temporal change in electric power demand and supply in the power over fiber system shown in FIG. 8.

FIG. 8 shows a configuration of a power over fiber system 1A2 provided with a function of feedback feed light.

The power over fiber system 1A2 is configured by further having the following components in the powered device 310 and the power sourcing equipment 110 of the power over fiber system 1A (configured as shown in FIG. 1) described as the first embodiment.

The powered device 310 includes a switchable mirror 311E as an optical branching device for feedback and a control device 312E.

The switchable mirror 311E outputs a portion of the feed light 112 to be input to the photoelectric conversion element 311 from the power sourcing equipment 110, to the power supplying side as the feedback feed light 112F. The switchable mirror 311E is an electronic device that is electrically switchable between the mirror state and the transparent state. Adjustment of the light amount of the feedback feed light 112F may be performed by variable control of the ratio of reflectance to transmittance, or by variable control of the duty ratio of the period of reflection to the period of transmission that are periodically performed. Instead of the switchable mirror 311E, a mechanism that mechanically switches reflection and transmission may be used to perform the adjustment.

The control device 312E monitors the power supply amount (Q1) of the electric power (Q) to the load 20, the electric power (Q) being obtained by the conversion by the photoelectric conversion element 311, and controls the feedback amount of feedback that is performed by the switchable mirror 311E, namely the light amount (P1) of the feedback feed light 112F, according to the power supply amount (Q1).

The power sourcing equipment 110 includes a combiner 111E as an optical combining device for feedback and a control device 114. The combiner 111E has an aperture through which feed light 112G from the semiconductor laser 111 enters, an aperture through which the feedback feed light 112F enters, and an aperture through which the feed light 112 as combined feed light of the feed light 112G and the feedback feed light 112F exits. That is, the combiner 111E combines the feedback feed light 112F that is from the powered device 310 and the feed light 112G output by the semiconductor laser 111 into combined feed light, and outputs the combined feed light.

The control device 114 controls output of the semiconductor laser 111 such that the energy amount that the combiner 111E outputs is constant (P). For that, the control device 114 detects the output (P) of the semiconductor laser 111.

Herein, P represents the electric power equivalent of the feed light 112, P1 represents the electric power equivalent of the feedback feed light 112F, Q represents the electric power obtained by the conversion by the photoelectric conversion element 311, and Q1 represents the power supply amount to the load 20. The electric power equivalent P of the feed light 112 is constant. FIG. 6 and FIG. 9 each show a graph of temporal change in P, Q and so forth.

The power supply amount Q1 to the load 20 fluctuates according to the operation status of the load 20, for example, as shown in FIG. 6.

FIG. 6 shows the case where 110% electric power Q is prepared, wherein the maximum value of the load 20 is 100%. Since the load 20 fluctuates in the range of up to the maximum value, no electric power shortage occurs, and consequently the system can be prevented from going down.

However, in this case, the surplus electric power R1 is wasted, which is inefficient.

The control device 312E controls the feedback amount of feedback that is performed by the switchable mirror 311E, namely the electric power equivalent P1 of the feedback feed light 112F, such that the electric power Q obtained by the conversion by the photoelectric conversion element 311 converges to a target value that exceeds the load 20 by a predetermined percentage.

In this manner, a portion of the surplus electric power R1 is transmitted to the power supplying side as the feedback feed light 112F before converted into electric power.

The feedback feed light 112F is input to the combiner 111E and constitutes part of the feed light 112.

The feed light 112 corresponds to the sum of the feedback feed light 112F and the feed light 112G output by the semiconductor laser 111.

The lower limit of the predetermined percentage is 0%, and the upper limit thereof is a percentage by which the electric power Q exceeds the maximum value of the load 20. In this example, the percentage by which the electric power Q exceeds the maximum value of the load 20 is 10%. Hence, the predetermined percentage is set in the range of 0-10%. For example, the target value is set to a value that is 10% higher than the load 20, which is shown in FIG. 9.

If the power supply amount Q1 to the load 20 is the maximum value, 100%, the feedback feed light 112F (P1) is zero and no feedback is performed. As the power supply amount Q1 to the load 20 decreases from the maximum value, the feedback feed light 112F (P1) is increased to keep the surplus electric power R2 small.

Although the electric power equivalent P of the feed light 112 that is output by the power sourcing equipment 110 is constant, since the electric power that cannot be unconsumed by the load 20 is fed back as the feedback feed light 112F before converted into electric power, the electric power newly provided from the power source 10 is only "P−P1" equivalent, which enables execution of efficient optical power supply with the surplus electric power R2 at the power receiving side controlled even if the load 20 fluctuates.

In the above description, loss due to the transmission efficiency and so forth being not 100% is ignored. Since the feedback is performed before the conversion into electric power, the feedback can be performed without loss due to the photoelectric conversion, which is efficient.

The load 20 includes an external load (electric power that is output for an external device(s)) in addition to the driving power needed in the powered device 310.

The power over fiber system 1A2 shown in FIG. 8 is configured by the first embodiment as a base, but may be configured by the power over fiber system 1 or 1B (configured as shown in FIG. 2 to FIG. 4), the power over fiber system 1 being described as the second embodiment, as a base with the components (111E, 311E, 312E) for achieving the function of feedback power supply added in the same manner, thereby being carried out as a configuration including an optical communication system.

In this case, the electric power Q obtained by the conversion by the photoelectric conversion element 311 of the powered device 310 is also used as the driving power for the transmitter 320 and the receiver 330 of the second data communication device 300.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

INDUSTRIAL APPLICABILITY

The present invention is usable for optical power supply.

The invention claimed is:

1. An optical power supply system, comprising:
a power sourcing equipment including a semiconductor laser that is configured to output feed light; and
a powered device including a photoelectric conversion element that is configured to convert the feed light into electric power, the feed light being from the power sourcing equipment,
wherein
the powered device further includes
an optical branching device for feedback configured to output a portion of the feed light to be input to the photoelectric conversion element from the power sourcing equipment, to a power supplying side as feedback feed light; and
a first control device configured to
monitor a power supply amount of the electric power to a load, the electric power being obtained by the conversion by the photoelectric conversion element, and
according to the power supply amount, control a feedback amount of feedback being performed by the optical branching device, and
the power sourcing equipment further includes:
an optical combining device for feedback configured to combine the feedback feed light that is from the powered device and the feed light output by the semiconductor laser into combined feed light, and output the combined feed light; and
a second control device configured to control output of the semiconductor laser such that an energy amount that the optical combining device is configured to output is constant.

2. The optical power supply system according to claim 1, comprising:
a first data communication device including the power sourcing equipment; and
a second data communication device including the powered device and configured to perform optical communication with the first data communication device,
wherein the second data communication device further includes a transmitter and a receiver, and the transmitter and the receiver are configured to be driven by the electric power obtained by the conversion by the photoelectric conversion element.

3. The optical power supply system according to claim 2, further comprising an optical fiber cable having one end connectable to the power sourcing equipment and another end connectable to the powered device, the optical fiber cable configured to transmit the feed light.

4. The optical power supply system according to claim 2, further comprising an optical fiber cable having one end connectable to the first data communication device and another end connectable to the second data communication device, the optical fiber cable configured to transmit the feed light and signal light.

5. The optical power supply system according to claim 1, wherein the first control device is configured to control the feedback amount of feedback to cause the electric power obtained by the conversion by the photoelectric conversion element to converge to a target value that exceeds the load by a predetermined percentage.

6. The optical power supply system according to claim 1, wherein a semiconductor material of a semiconductor region of the photoelectric conversion element, the semiconductor region exhibiting a light-electricity conversion effect, is a laser medium having a laser wavelength of 500 nm or less.

7. The optical power supply system according to claim 1, wherein a semiconductor material of a semiconductor region of the semiconductor laser, the semiconductor region exhibiting a light-electricity conversion effect, is a laser medium having a laser wavelength of 500 nm or less.

* * * * *